(12) United States Patent
Pillarisetty et al.

(10) Patent No.: US 9,478,635 B2
(45) Date of Patent: Oct. 25, 2016

(54) GERMANIUM-BASED QUANTUM WELL DEVICES

(71) Applicant: Intel Corporation, Santa Clara, CA (US)

(72) Inventors: Ravi Pillarisetty, Portland, OR (US); Been-Yih Jin, Lake Oswego, OR (US); Benjamin Chu-Kung, Portland, OR (US); Matthew V. Metz, Portland, OR (US); Jack T. Kavalieros, Portland, OR (US); Marko Radosavljevic, Beaverton, OR (US); Roza Kotlyar, Portland, OR (US); Willy Rachmady, Beaverton, OR (US); Niloy Mukherjee, Beaverton, OR (US); Gilbert Dewey, Hillsboro, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/924,643

(22) Filed: Oct. 27, 2015

(65) Prior Publication Data

US 2016/0064520 A1 Mar. 3, 2016

Related U.S. Application Data

(60) Continuation of application No. 14/057,204, filed on Oct. 18, 2013, now Pat. No. 9,219,135, which is a continuation of application No. 13/442,098, filed on Apr. 9, 2012, now Pat. No. 8,592,803, which is a division of application No. 12/655,468, filed on Dec. 30, 2009, now Pat. No. 8,193,523.

(51) Int. Cl.
*H01L 29/66* (2006.01)
*H01L 29/267* (2006.01)
(Continued)

(52) U.S. Cl.
CPC ... *H01L 29/66553* (2013.01); *H01L 21/02532* (2013.01); *H01L 21/02546* (2013.01); *H01L 21/283* (2013.01); *H01L 29/155* (2013.01);
(Continued)

(58) Field of Classification Search
None
See application file for complete search history.

(56) References Cited

U.S. PATENT DOCUMENTS

| 5,124,762 A | 6/1992 | Childs et al. |
| 5,351,128 A | 9/1994 | Goto et al. |

(Continued)

FOREIGN PATENT DOCUMENTS

| JP | 04-326734 A | 11/1992 |
| JP | 11-251575 A | 9/1999 |

(Continued)

OTHER PUBLICATIONS

Notice of Allowance received for Taiwan Patent Application No. 099143226, mailed on Sep. 25, 2014, 2 pages of Notice of Allowance only.

(Continued)

*Primary Examiner* — Joseph Schoenholtz
(74) *Attorney, Agent, or Firm* — Winkle, PLLC

(57) ABSTRACT

A quantum well transistor has a germanium quantum well channel region. A silicon-containing etch stop layer provides easy placement of a gate dielectric close to the channel. A group III-V barrier layer adds strain to the channel. Graded silicon germanium layers above and below the channel region improve performance. Multiple gate dielectric materials allow use of a high-k value gate dielectric.

14 Claims, 15 Drawing Sheets

(51) Int. Cl.
| | |
|---|---|
| *H01L 21/283* | (2006.01) |
| *H01L 29/15* | (2006.01) |
| *H01L 21/02* | (2006.01) |
| *H01L 29/165* | (2006.01) |
| *H01L 29/778* | (2006.01) |
| *H01L 29/775* | (2006.01) |
| *H01L 29/51* | (2006.01) |

(52) U.S. Cl.
CPC .......... *H01L 29/165* (2013.01); *H01L 29/267* (2013.01); *H01L 29/66431* (2013.01); *H01L 29/775* (2013.01); *H01L 29/7782* (2013.01); *H01L 29/517* (2013.01)

(56) References Cited

U.S. PATENT DOCUMENTS

| | | | |
|---|---|---|---|
| 5,906,951 | A | 5/1999 | Chu et al. |
| 6,133,593 | A | 10/2000 | Boos et al. |
| 6,331,467 | B1 | 12/2001 | Brown et al. |
| 6,607,948 | B1 | 8/2003 | Sugiyama et al. |
| 7,393,735 | B2 | 7/2008 | Chu et al. |
| 7,429,747 | B2 | 9/2008 | Hudait et al. |
| 7,435,987 | B1 | 10/2008 | Chui et al. |
| 7,573,059 | B2 | 8/2009 | Hudait et al. |
| 7,759,142 | B1 | 7/2010 | Majhi et al. |
| 7,947,971 | B2 | 5/2011 | Majhi et al. |
| 8,193,523 | B2 | 6/2012 | Pillarisetty et al. |
| 8,592,803 | B2 | 11/2013 | Pillarisetty et al. |
| 9,219,135 | B2 | 12/2015 | Pillarisetty et al. |
| 2002/0105015 | A1 | 8/2002 | Kubo et al. |
| 2005/0279992 | A1 | 12/2005 | Gupta et al. |
| 2006/0148182 | A1 | 7/2006 | Datta et al. |
| 2006/0157732 | A1 | 7/2006 | Von Kaenel et al. |
| 2007/0066023 | A1 | 3/2007 | Thakur et al. |
| 2007/0138565 | A1* | 6/2007 | Datta .............. H01L 21/823807 257/369 |
| 2007/0246701 | A1 | 10/2007 | Yanson et al. |
| 2008/0070395 | A1 | 3/2008 | Yen et al. |
| 2008/0142786 | A1 | 6/2008 | Datta et al. |
| 2008/0203381 | A1 | 8/2008 | Hudait et al. |
| 2008/0210927 | A1 | 9/2008 | Hudait et al. |
| 2008/0296622 | A1 | 12/2008 | Kiewra et al. |
| 2009/0001350 | A1 | 1/2009 | Hudait et al. |
| 2009/0081839 | A1 | 3/2009 | Chu |
| 2009/0242872 | A1 | 10/2009 | Pillarisetty et al. |
| 2009/0272982 | A1 | 11/2009 | Nakamura et al. |
| 2011/0156005 | A1 | 6/2011 | Pillarisetty et al. |

FOREIGN PATENT DOCUMENTS

| | | |
|---|---|---|
| JP | 2000-286413 A | 10/2000 |
| JP | 2004-221363 A | 8/2004 |
| JP | 2005-251820 A | 9/2005 |
| JP | 2006-295170 A | 10/2006 |
| JP | 2008-060359 A | 3/2008 |
| JP | 04-352332 B2 | 10/2009 |
| TW | 415103 B | 12/2000 |
| TW | 200618277 A | 6/2006 |
| WO | 2008/036681 A1 | 3/2008 |
| WO | 2008/041277 A1 | 4/2008 |
| WO | 2011/090583 A2 | 7/2011 |
| WO | 2011/090583 A3 | 10/2011 |

OTHER PUBLICATIONS

Office Action received for Taiwan Patent Application No. 099143226, mailed on Jan. 22, 2014, 10 pages of Taiwan Office Action and 20 pages of English Translation.
Notice of Allowance received for Korean Patent Application No. 10-2012-7016799, mailed on Feb. 26, 2014, 4 pages of Korean Office Action and 1 page of English Translation.
Office Action received for Korean Patent Application No. 10-2012-7016799, mailed on Jan. 13, 2014, 5 pages of English Translation only.
Office Action received for Korean Patent Application No. 10-2012-7016799, mailed on Jul. 19, 2013, 20 pages of Korean Office Action and 9 pages of English Translation.
Extended European Search Report received for European Patent Application No. 108441775, mailed on Sep. 8, 2014, 14 pages.
Tadigadapa, "Lecture 19 Etching", EE441, Spring 2009, 11 pages.
Office Action received for Chinese Patent Application No. 2010800605555, mailed on Jun. 5, 2014, 4 pages of English Translation and 7 pages of Chinese Office Action.
Notice of Allowance received for Japanese Patent Application No. 2012-544639, mailed on Nov. 18, 2014, 3 pages of Notice of Allowance only.
Office Action received for Japanese Patent Application No. 2012-544639, mailed on Jan. 14, 2014, 4 pages of Japanese Office Action and 4 pages of English Translation.
Office Action received for Japanese Patent Application No. 2014-081243, mailed on Jan. 6, 2015, 3 pages of English Translation and 3 pages of Japanese Office Action.
Office Action received for Korean Patent Application No. 2014-7003586, mailed on Oct. 26, 2015, 5 page of English Translation and 5 pages of Korean Office Action.
Donnelly, et al., "Plasma Etching: Yesterday, Today, and Tomorrow", Journal of Vacuum Science & Technology, A, vol. 31, No. 5, Sep. 5, 2013, 48 pages.
Duty, et al., "Wet Etching Fundamentals", ENEE416, Sep. 29, 2011, 13 pages.
Liu, "Design, Fabrication and Characterization of INALAS/INGAAS/INASP Composite Channel Flemts", Dissertation, 2008, 195 pages.
International Preliminary Report on Palatability and Written Opinion received for PCT Patent Application No. PCT/US2010/059620, mailed on Jul. 12, 2012, 10 pages.
International Search Report and Written Opinion received for PCT Patent Application No. PCT/US2010/059620, mailed on Aug. 25, 2011, 12 pages.
Reyes-Betanzo, et al., "Plasma Etching of Silicon Nitride with High Selectivity Over Silicon Oxide and Silicon in Fluorine Containing Plasmas", Journal of Vacuum Science Technology, A, vol. 17, No. 6, 1999, 1 page.
Robertson, "High Dielectric Constant Gate Oxides for Metal Oxide Si Transistors", Reports on Progress in Physics, vol. 69, 2006, 71 pages.
Office Action received for Taiwan Patent Application No. 103137422, mailed on Mar. 25, 2016, 11 pages of English Translation and 8 pages of Taiwan Office Action.
Extended European Search report received for European Patent Application No. 15162629.8, mailed on Dec. 17, 2015, 14 pages.
Notice of Allowance received for Korean Patent Application No. 2014-7003586, mailed on Apr. 12, 2016, 1 page of English Translation and 3 pages of Korean Notice of Allowance.

* cited by examiner

| Contact Region 244 |
|---|
| Upper Barrier Region 214 |
| Doped Region 212 |
| Upper Spacer Region 242 |
| Etch Stop Region 240 |
| First Spacer Region 210 |
| Channel Region 208 |
| Lower Barrier Region 206 |
| Buffer Region 204 |
| Substrate 202 |

Figure 5

GERMANIUM-BASED QUANTUM WELL DEVICES

RELATED APPLICATIONS

The present application is a Continuation of U.S. patent application Ser. No. 14/057,204, filed on Oct. 18, 2013, entitled "GERMANIUM-BASED QUANTUM WELL DEVICES", which is a Continuation of U.S. patent application Ser. No. 13/442,098, filed on Apr. 9, 2013, now issued U.S. Pat. No. 8,592,803 granted on Nov. 26, 2013, entitled "GERMANIUM-BASED QUANTUM WELL DEVICES", which is a Divisional of U.S. patent application Ser. No. 12/655,468, filed on Dec. 30, 2009, now issued U.S. Pat. No. 8,193,623 granted on Jun. 5, 2012, entitled "GERMANIUM-BASED QUANTUM WELL DEVICES".

BACKGROUND

Background of the Invention

Most integrated circuits today are based on silicon, a Group IV element of the Periodic Table. Quantum well transistors based on non-silicon materials may provide superior device performance.

BRIEF DESCRIPTION OF THE DRAWINGS

FIG. 5 is a cross sectional side view that shows a material stack that may be used to form another embodiment of a germanium quantum well channel transistor device.

DETAILED DESCRIPTION

In various embodiments, a germanium channel quantum well semiconductor device and its fabrication are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment that falls within the scope of the invention, but do not denote that they are necessarily present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
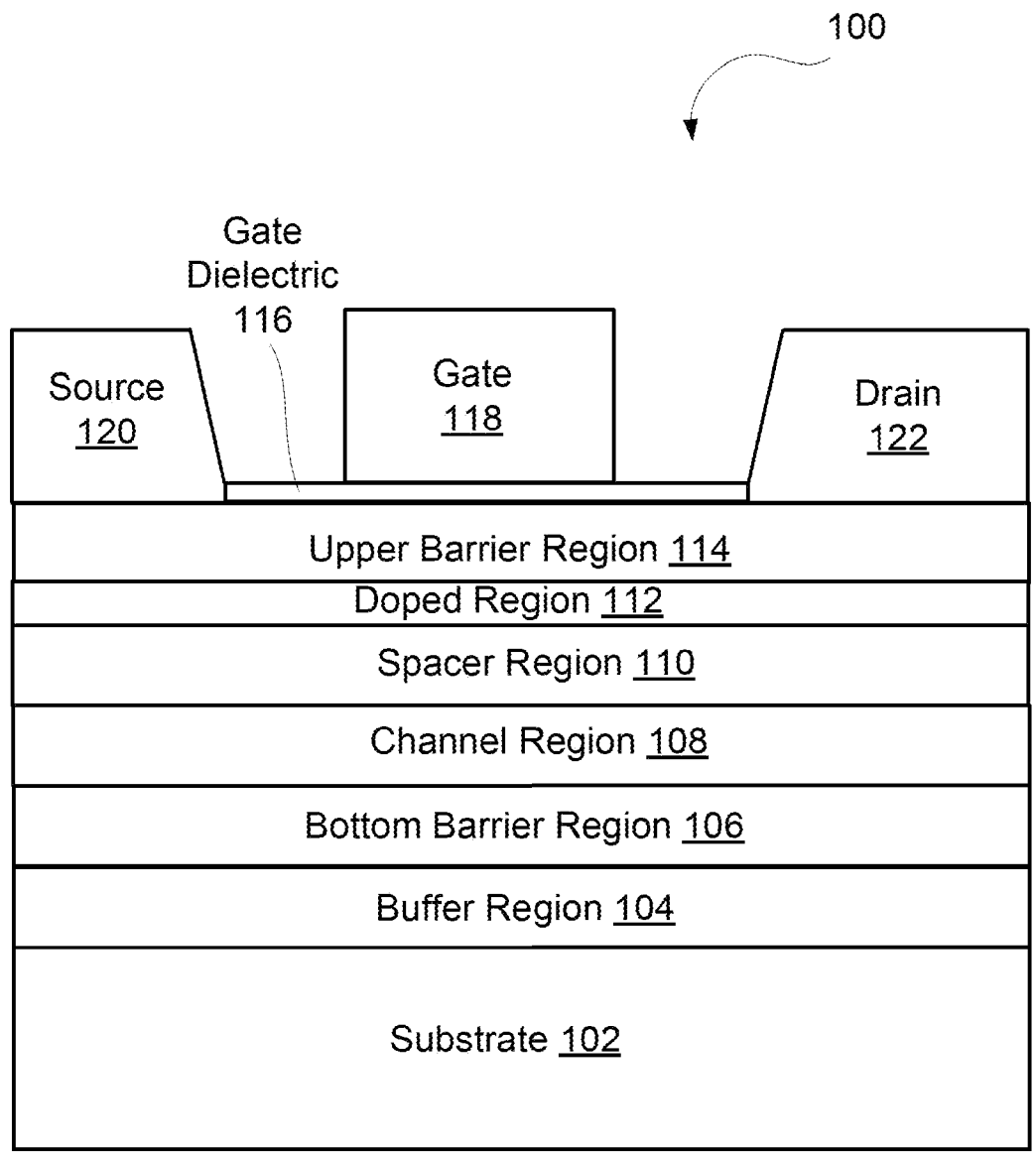
FIG. 1 is a cross sectional side view that illustrates a germanium quantum well channel transistor device.

FIG. 1 is a cross sectional side view that illustrates a germanium quantum well channel transistor device 100, according to one embodiment of the present invention. In the illustrated embodiment, the device 100 includes a substrate 102, which may be any material or materials on which the device 100 may be made. In some embodiments the substrate 102 may be a substantially single-crystal silicon material, a substantially single-crystal silicon material that is doped, a multi-crystal or multi-layer substrate 102, or a semiconductor-on-insulator substrate 102. The substrate 102 may not comprise silicon in some embodiments, but may instead comprise a different substrate material, such as Ge, GaAs or InP. The substrate 102 may include one or more material(s), device(s), or layer(s), or may be a single material without multiple layers.

The substrate 102 surface on which the device 100 is to be formed may have a resistance between about 1 ohm and about 50,000 ohms per centimeter. The high resistivity may be achieved by a low dopant concentration, lower than about $10^{16}$ carriers/cm$^3$. In other embodiments, the substrate 102 may have different resistivities or the resistance may be achieved by other methods.

There is a buffer region 104 on the substrate 102 in the illustrated embodiment. The buffer region 104 may function to accommodate for a lattice mismatch between the substrate 102 and regions above the buffer region 104 and to confine lattice dislocations and defects.

There is a lower barrier region 106 on the buffer region 104, a channel region 108 on the lower barrier region 106, a first spacer region 110 on the channel region 108, a doped region 112 on the spacer region 110, and an upper barrier region 114 on the doped region 112 in the illustrated embodiment.

The lower barrier region 106 may comprise a material with a higher band gap than the material of which the channel region 108 is comprised. The lower barrier region 106 comprises silicon and germanium in the illustrated embodiment, although in other embodiments it may comprise other materials such as InAlAs, InGaAs, GaAs, AlGaAs, InAlSb or InP (note that various materials similar to this may be used in other regions of the device 100 such as the spacer regions and barrier regions). In embodiments where the lower barrier region 106 comprises SiGe, various ratios of Si to Ge may be used. In an embodiment, the bottom barrier region comprises SiGe, so the ratio is 50% Si and 50% Ge. In other embodiments, the ratio may be chosen to impart a strain on the channel region 108 or for other reasons. For example, in an embodiment the bottom barrier region 106 comprises 70% SiGe and 30% Si. In another embodiment, the bottom barrier region 106 comprises between 60% and 80% SiGe and between 40% and 20% Si. In other embodiments, different ratios may be used.

The lower barrier region 106 may be doped or undoped. Any suitable method may be used to form the lower barrier region 106. In some embodiments, the lower barrier region 106 may have a thickness between about one micron and three microns or less. In an embodiment the lower barrier region 106 has a thickness less than about 500 nanometers, in another embodiment the lower barrier region 106 has a thickness of about 100 nanometers, and in other embodiments it may have yet other thicknesses.

The channel region 108 may be a quantum well channel region 108. The quantum well channel region 108 comprises Ge. In an embodiment, the channel region consists substantially of all Ge. In other embodiments, there may be other materials, such as Si, as part of the composition of the channel region 108. As mentioned above, the quantum well channel region 108 may be strained by lattice size mismatch with the layers (such as the bottom barrier region 106) adjacent to the channel region 108. In some embodiments, the channel region 106 is not strained. Any suitable method may be used to form the quantum well channel region 108. In some embodiments, the quantum well channel region 108 may have a thickness between about 3 nanometers and twenty nanometers, although it may be less or more than that in other embodiments. In one embodiment, it has a thickness of about 10 nanometers.

The first spacer region 110 may comprise the same or a similar material as the lower barrier region 106 in one embodiment, may comprise intrinsic undoped SiGe in another embodiment, and in other embodiments it may comprise a different material. The first spacer region 110 may be formed by any suitable method. In one embodiment, the first spacer region 110 has a thickness less than about 5 nanometers. In another embodiment, the first spacer region 110 has a thickness of about 2 nanometers. In other embodiments, the first spacer 110 may have other thicknesses.

The doped region 112 is on the spacer region 110 and is doped according to the design of the device 100 and the targeted threshold voltage of the device 100 in an embodiment. Note that the term "doped region 112" as used herein may be a modulation doped region, a delta-doped region or another type of doped region in various embodiments.

The doped region 112 may comprise substantially the same material as the spacer region 110, with the addition of a dopant or dopants. For example, in an embodiment where the spacer region 110 comprises SiGe, the doped region 112 also comprises SiGe with the addition of a dopant. The dopant used in the doped region 116 may be boron or another p-type dopant. There may be a dopant density in the doped region 112 of between about $1 \times 10^{11}$/cm$^2$ to about $8 \times 10^{12}$/cm$^2$ in some embodiments, between about zero (undoped) and $5 \times 10^{13}$/cm$^2$ in other embodiments, although different dopant densities may be used in yet other embodiments. The density of dopants may be chosen based by the device 100 design and targeted threshold voltage of the device. In another embodiment, the doped region 112 may comprise a different material than SiGe that is doped. In some embodiments, the doped region 112 may have a thickness of less than about 50 angstroms. In another embodiment, the doped region 112 has a thickness of about 20 angstroms or less. In other embodiments, the doped region 112 may have other thicknesses.

There is an upper barrier region 114 on the doped region 112 in the device 100 illustrated in FIG. 1. The upper barrier region 114 may comprise intrinsic undoped SiGe in an embodiment, silicon and germanium in varying ratios in other embodiments, Si in another embodiment, other materials in other embodiments, and may consist of substantially the same material as the lower barrier region 106 and/or the spacer region 110 in yet other embodiments. The upper barrier region 114 may comprise a material with a larger band gap than the channel region 108 in an embodiment. The upper barrier region 114 may be formed by any suitable method. In one embodiment, the upper barrier region 114 has a thickness less than about 5 nanometers. In another embodiment, the upper barrier region 114 has a thickness of about 2 nanometers. In other embodiments, the upper barrier region 114 may have other thicknesses. This thickness may be chosen based on the targeted threshold voltage for the device 100.

In an embodiment, the spacer region 110, doped region 112, and the upper barrier region 114 may be formed with a continuous growth process. For example, the spacer region 110 can comprise SiGe and be formed in a chamber. To form the doped region 112 the precursor flows are changed to include the dopant. To form the upper barrier region 114, the precursor flows are changed again to those used to form the spacer region 110. In other embodiments, different ways to form the regions may be used and the regions 110, 112, 114 may not have so similar a composition.

There is a gate dielectric 116 on the upper barrier region 114 and a gate 118 on the gate dielectric 116 in the illustrated embodiment. The gate dielectric 116 may comprise a material with a high dielectric constant (high-k dielectric). The gate dielectric 116 may comprise a material with a high dielectric constant (high-k dielectric) such as $Al_2O_3$, although other materials such as $La_2O_3$, $HfO_2$, $ZrO_2$, $TaO_5$, or ternary complexes such as $LaAl_xO_y$, $Hf_xZr_yO_z$ or other materials may be used in other embodiments. In embodiments where the gate dielectric 116 is $Al_2O_3$, the $Al_2O_3$ may be deposited using trimethylaluminum (TMA) and water precursors with and ALD process in one embodiment, although other methods to form it may be used. In an embodiment, the gate dielectric 116 has a thickness between about 0.7 nanometers and 5 nanometers, in another embodiment the gate dielectric 116 has a thickness less than 5 nanometers, and in other embodiments the gate dielectric 116 may have different thicknesses.

The gate 118 may comprise a metal-containing material such as Pt/Au, Ti/Au, Ti/Pt/Au, or another material or materials. In various embodiments, the material or materials of the gate 118 may be chosen to provide a desired workfunction. Source 120 and drain 122 regions may be formed adjacent the gate dielectric 116 and/or gate 118. In one embodiment, the source and drain regions may comprise NiGeAu. In another embodiment, the source and drain regions may comprise TiPtAu. In other embodiments, the source and drain regions 120, 122 may comprise another material or materials.

Figure 2:
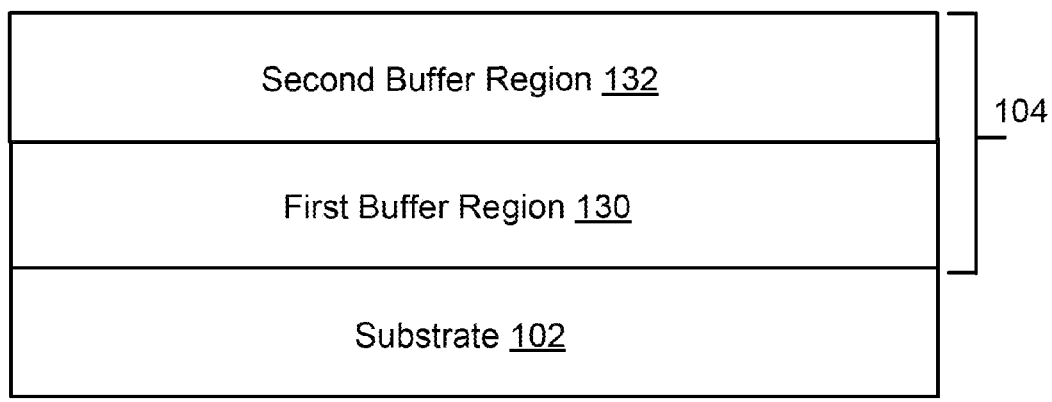
FIG. 2 is a cross sectional side view that illustrates a buffer region that is formed on the substrate.

FIG. 2 is a cross sectional side view that illustrates a buffer region 104 that is formed on the substrate 102 in one embodiment. The buffer region 104 may function to accommodate for a lattice mismatch between the substrate 102 and regions above the buffer region 104 and to confine lattice dislocations and defects. In the illustrated embodiment, the buffer region 104 has multiple regions: a first buffer region 130 and a second buffer region 132, although in other embodiments the buffer region 104 may have different numbers of regions or simply be a single region.

In an embodiment the substrate 102 comprises silicon, the bottom barrier region 106 comprises SiGe, and the first and second buffer regions 130, 132 comprise silicon and germanium in different amounts. For example, in an embodiment the first buffer region 130 comprises 30% SiGe with substantially all the rest being Si, and the second buffer region 132 comprises 70% SiGe with substantially all the rest being Si. Such an arrangement is a stepped buffer region 104, with discrete regions having increasing amounts of Ge. More than two stepped buffer regions and/or different changes in material amounts may be present in other embodiments.

In another embodiment there is a single graded buffer region 104 rather than multiple stepped buffer regions. The graded buffer region 104 comprises $Si_xGe_{1-x}$, with x ranging between 1 (or another selected starting amount) at the bottom of the buffer region 104 adjacent the substrate 102 to 0.5 (or another selected ending amount) at the top of the buffer region 104 adjacent the bottom barrier region 106.

In yet another embodiment there is a single non-graded buffer region 104 with a substantially homogenous SiGe (intrinsic or in a selected ratio with Si or another material) composition all the way from the bottom of the buffer region 104 adjacent the substrate 102 to the top of the buffer region 104 adjacent the bottom barrier region 106.

In embodiments with different materials in the substrate 102 and/or bottom barrier region 106, the buffer region 104 may also comprise a different material selected to form a relaxed top portion with reduced defects compared to the bottom of the buffer region 104. For example, in an embodiment where the bottom barrier region 106 comprises GaAs, the top portion of the buffer region 104 may comprise Ge, which is substantially lattice-matched to GaAs. The buffer region 104 may thus be graded so there is increasing Ge and decreasing Si further from the substrate 102, may be stepped to have more Ge and less Si further from the substrate 102, or may simply be a layer of Ge. In other material schemes, different buffer regions 104 with different materials and buffering may be used.

The buffer region 104 (and any sub-regions 130, 132) may have sufficient thickness that most defects present at its bottom surface are not present at its top surface. Any suitable method may be used to form the buffer region 104.

In some embodiments, the buffer region 104 may also include a nucleation region between the first buffer region 130 and the substrate 102. For example, an embodiment may have a substrate 102 with an offcut vicinal surface and a III-V material, such as GaAs, buffer region 104. The nucleation region comprises gallium arsenide in one embodiment, although other materials such as GaSb or AlSb may be used in other embodiments. (Note that as used herein, when materials designated by their elements without subscripts, these designations encompass any mix of percentages of the elements. For example, "InGaAs" encompasses $In_xGa_{1-x}As$, with x ranging between zero (GaAs) and one (InAs). Similarly, InAlAs encompasses $In_{0.52}Al_{0.48}As$.) It is formed by molecular beam epitaxy (MBE), migration enhanced epitaxy (MEE), metal-organic chemical vapor deposition (MOCVD), atomic layer epitaxy (ALE), chemical beam epitaxy (CBE), or another suitable method. It may be annealed after formation to reduce dislocations. It has a thickness of less than about 1000 angstrom in some embodiments, a thickness of less than about 500 angstroms in some other embodiments. In one embodiment, the nucleation region has a thickness of about 300 angstroms. In embodiments where the substrate 102 is a vicinal silicon material, the nucleation region may be made sufficiently thick to fill all the terraces of the silicon substrate 102. In an alternative embodiment, other suitable nucleation region materials or thicknesses may be used, or the nucleation region may be omitted.

Such a device with a Ge-based quantum well channel region 106 may provide a p-type transistor that provides better performance than other types of transistors.

Figure 3:
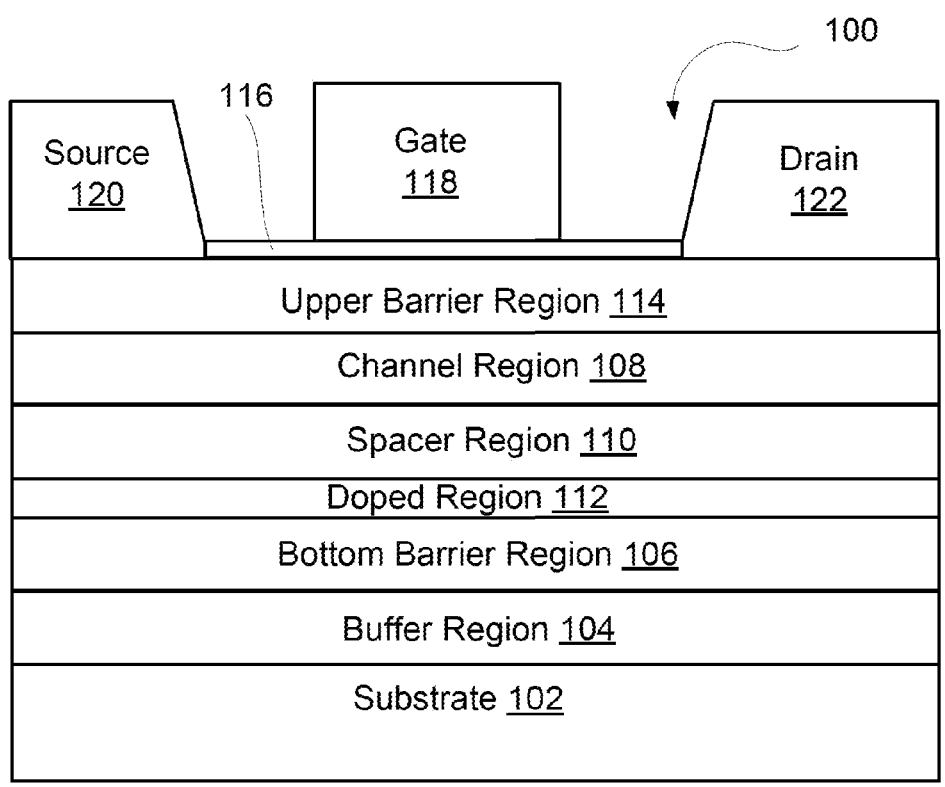
FIG. 3 is a cross sectional side view that illustrates another embodiment of a germanium quantum well channel transistor device.

FIG. 3 is a cross sectional side view that illustrates a germanium quantum well channel transistor device 100, according to one embodiment of the present invention. The device 100 of FIG. 3 is similar to the device of FIG. 1, but with the doped region 112 and spacer region 110 below the channel region 108 rather than above the channel region 108. This allows the channel region 108 to be closer to the gate 118 and may provide increased performance.

Figure 4:
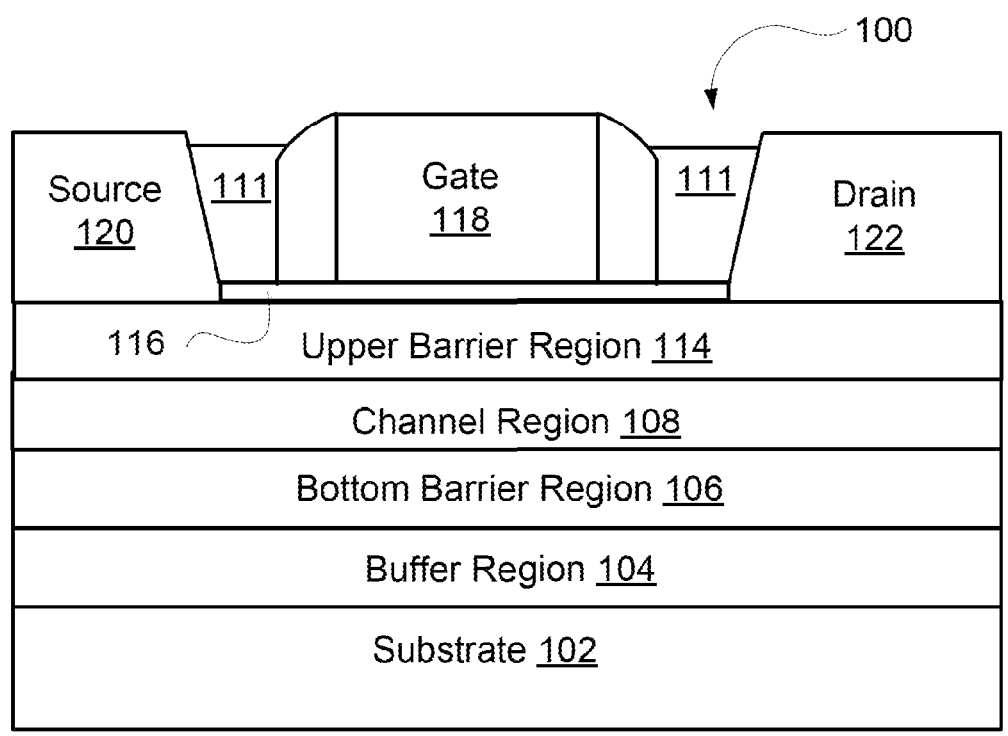
FIG. 4 is a cross sectional side view that illustrates another embodiment of a germanium quantum well channel transistor device.

FIG. 4 is a cross sectional side view that illustrates a germanium quantum well channel transistor device 100, according to one embodiment of the present invention. The device 100 of FIG. 3 is similar to the device of FIG. 1, but lacks the doped region 112 and spacer region 110 in the material stack from which the device 100 is formed. Instead, there is a doped region 111 elsewhere in the device 100, which may be formed after the formation of the gate dielectric 116 and gate 118. In the illustrated embodiment, there are spacers on either side of the gate 118 and a doped region 111 between the spacer and the contact stack. The doped region 111 in such a device may have different sizes, shapes and placements, and there may or may not be spacers in such an alternative device. Forming a device 100 with a doped region 111 that is not a blanket layer as part of the material stack may simplify creation of the device 100.

FIG. 5 is a cross sectional side view that shows a material stack that may be used to form another embodiment of a germanium quantum well channel transistor device. This material stack includes a substrate 202, buffer region 204, lower barrier region 206, channel region 208, first spacer region 210, doped region 212 and upper barrier region 214 that may be similar to the substrate 102, buffer region 104, lower barrier region 106, channel region 108, spacer region 110, doped region 112 and upper barrier region 114, respectively, that are described above. The illustrated embodiment also includes an etch stop region 240 on the first spacer region 210 and an upper spacer region 242 on the etch stop region 240 and beneath the doped region 212.

In an embodiment, the spacer region 210 comprises SiGe, the etch stop region 240 comprises silicon and is substantially free from germanium, and the upper spacer region 242 comprises SiGe. In some embodiments, the upper spacer region 242 and lower spacer region 210 consist of substantially the same material, while in other embodiments there may be differences in composition of the two regions 210, 242. In some embodiments, the materials of the spacer regions 210, 242 and the etch stop region 240 are chosen to provide etch selectivity with a chosen etchant or etchants between the first spacer region 210 and the etch stop region 240 and between the etch stop region 240 and the upper spacer region 242. In an embodiment where the upper spacer 242 comprises SiGe and the etch stop region 240 comprises Ge, potassium hydroxide may be selected as an etchant that will remove the upper spacer region 242 and stop at the etch stop region 240. Other etchants and/or materials may be used in other embodiments. In an embodiment, both the etch stop region 240 and the lower spacer region 210 are thin. For example, the etch stop region 240 is ten angstroms thick or less and the first spacer region 210 is also ten angstroms thick or less. In other embodiments, either or both of the etch stop region 240 and first spacer region 210 may have greater thicknesses.

In the embodiment illustrated in FIG. 5, there is also a contact region 244 on the upper barrier region 214. This contact region 244 may be used to form source and drain contacts. In an embodiment, the contact region 244 comprises a p+ doped SiGe material, which may have boron as the dopant at a density of between about $1 \times 10^{19}/cm^2$ to about $1 \times 10^{22}/cm^2$ in. Other dopants, other concentrations, and other materials besides SiGe may be used in other embodiments.

Figure 6:
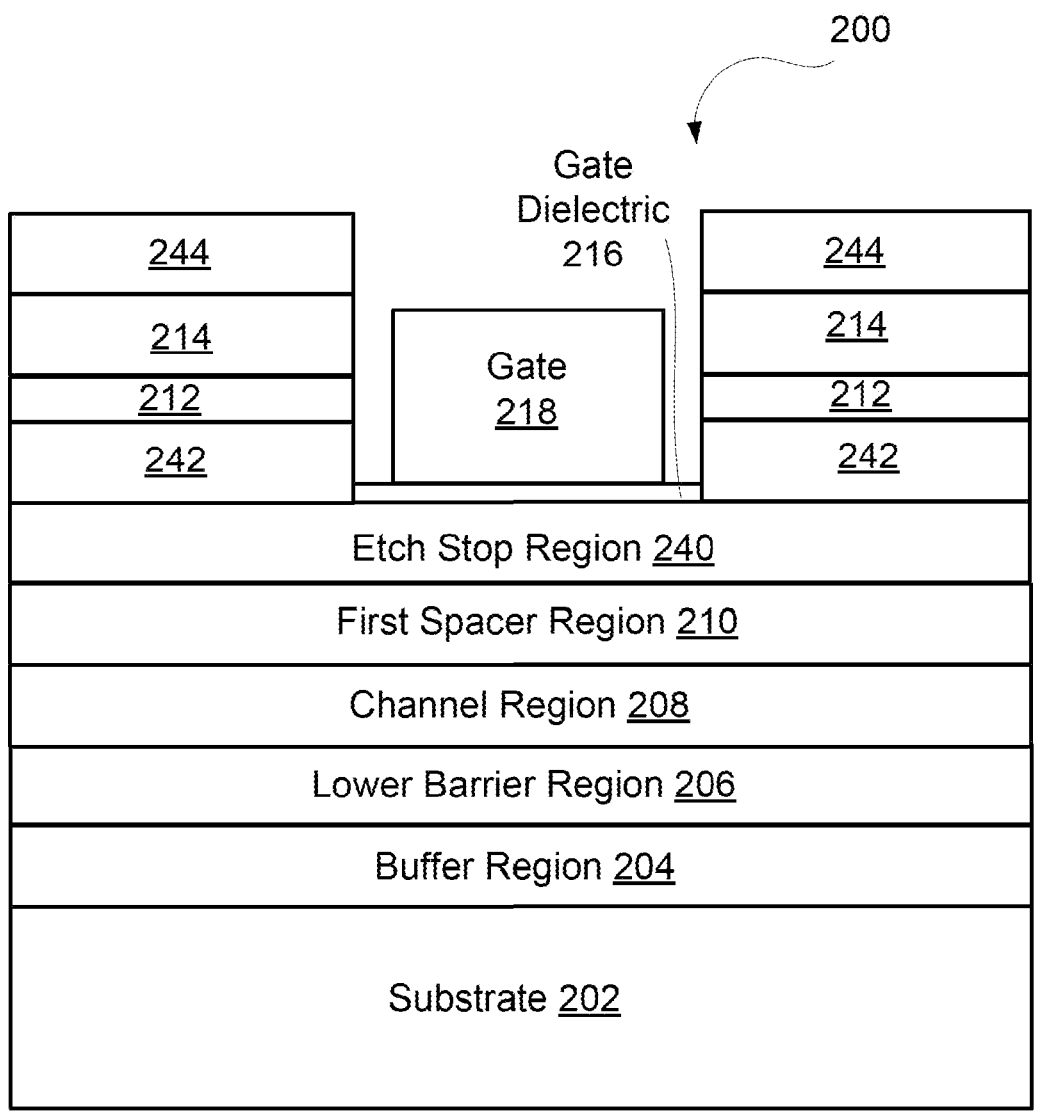
FIG. 6 is a cross sectional side view that illustrates a germanium quantum well channel transistor device.

FIG. 6 is a cross sectional side view that illustrates a germanium quantum well channel transistor device 200, according to one embodiment of the present invention. This device 200 may be formed from the material stack illustrated in FIG. 5 and may also have a gate dielectric 216 and gate 218 similar to those described with respect to the device 100 of FIG. 1. The device 200 has a recessed gate 218. As there is etch selectivity between the upper spacer region 242 and the etch stop region 240, the upper spacer region 242 (and other material above) may be removed leaving only a thin etch stop region 240 and first spacer region 210 between the channel region 208 and the gate dielectric 216. In embodiments such as device 100 that lack an etch stop region 240 it may be more difficult to get the channel region 108 as close to the gate 118 as the channel region 208 in FIG. 6 is, and thus it may be easier to achieve better performance with the device 200 of FIG. 6.

Additionally, it may be difficult to form a high-k gate dielectric 216 on SiGe. The presence of an etch stop region 240 that comprises a different material such as silicon may allow formation of a high-k gate dielectric 216 much more easily than if the device 200 lacked the etch stop region 240.

Adjacent the gate dielectric 216 and gate 218 are additional regions that are not beneath the gate dielectric 216 and gate 218. In the illustrated embodiment, these additional regions include the remaining portions of the upper spacer region 242, a doped region 212 on the upper spacer region 242, remaining portions of the upper barrier region 214 on the doped region 212, and remaining portions of the contact region 244 on the upper barrier region 214. These additional regions may be considered a contact stack, with a contact stack being shown on either side of the gate dielectric 216 and gate 218 in FIG. 6.

Figure 7:
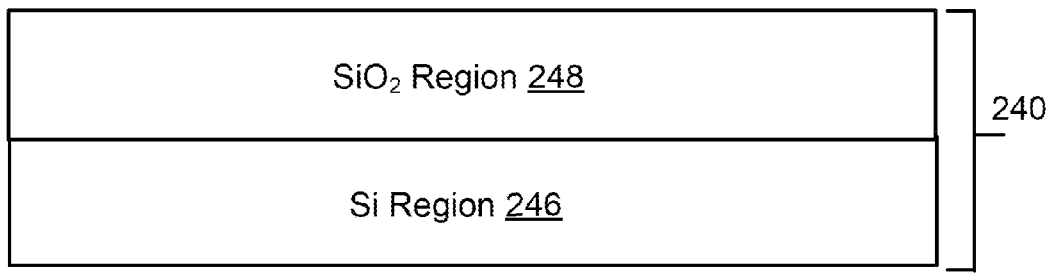
FIG. 7 is a cross sectional side view that illustrates the etch stop region present in some embodiments.

FIG. 7 is a cross sectional side view that illustrates the etch stop region 240 present in some embodiments. As seen in FIG. 7, the etch stop region 240 may include multiple regions. In an embodiment, the etch stop region 240 may include a first silicon region 246 and a second silicon dioxide region 248. The second silicon dioxide region 248 may be formed by oxidizing silicon of the etch stop region 240 after removal of a portion of the upper spacer region 242 above the etch stop region 240 to expose the portion of the etch stop region 240. As illustrated in FIG. 7, only an upper portion of the etch stop region 240 is oxidized, but in other embodiments, the whole thickness of the etch stop region 240 may be oxidized so that the etch stop region 240 under the gate 218 lacks a silicon region 246. Such a silicon dioxide region 248 may be formed if, for example, it would be easier to form the desired gate dielectric 216 material on silicon dioxide than on silicon. In other embodiments, different alterations to some or all of the etch stop region 240 beneath the gate 218 may be done by the addition, subtraction, or altering of material.

Figure 8:
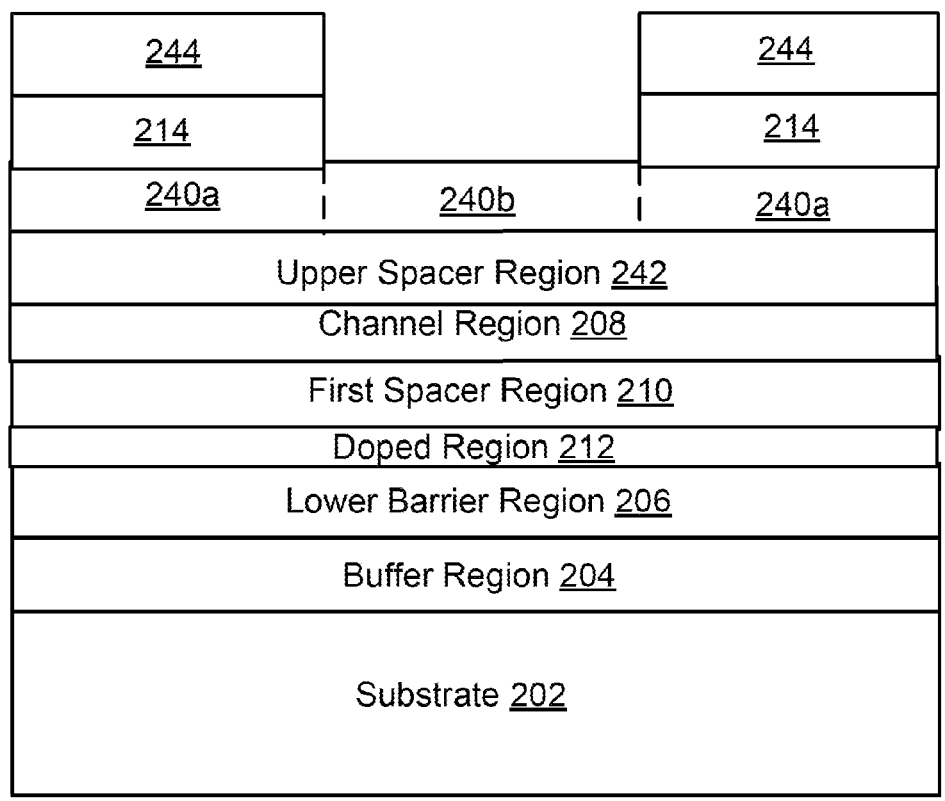
FIG. 8 is a cross sectional side view that illustrates what portion of the etch stop region may be altered in an embodiment.

FIG. 8 is a cross sectional side view that illustrates what portion of the etch stop region 240 may be altered in an embodiment. Regions 240a may remain silicon, while the region 240b that will be under the gate 218 is altered as described above. As described above, the entire thickness of region 240b may be altered (for example converted from silicon to silicon dioxide) or only a portion of the thickness. In other embodiments, the boundaries between the altered 240b and unaltered 240a regions of the etch stop region 240 may be in different places, and in some embodiments, the etch stop region 240 may not have an altered region 240b at all.

Figure 9:
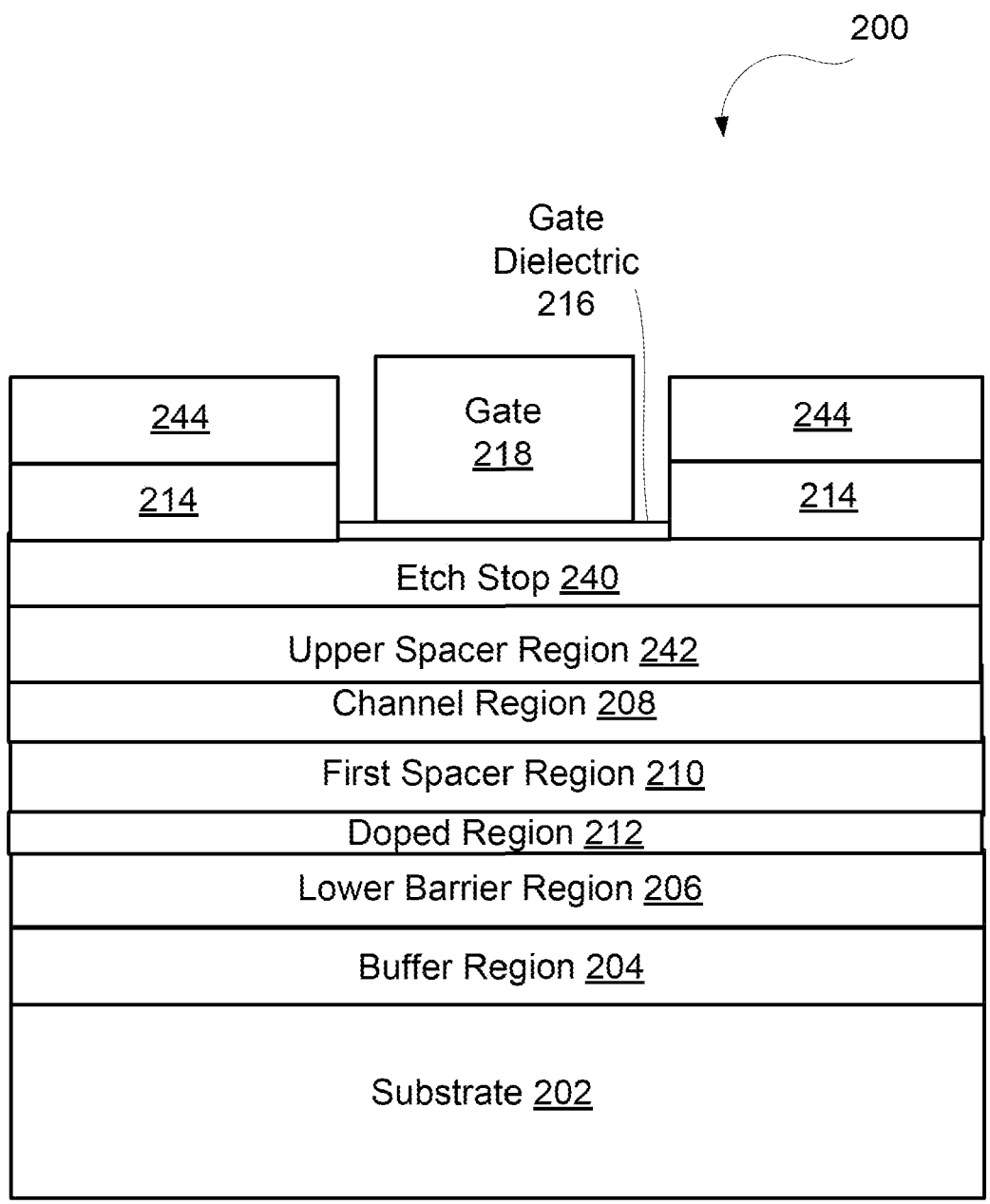
FIG. 9 is a cross sectional side view that illustrates a germanium quantum well channel transistor device, according to another embodiment of the present invention.

FIG. 9 is a cross sectional side view that illustrates a germanium quantum well channel transistor device 200, according to another embodiment of the present invention. This device 200 is similar to the device 200 of FIG. 6, but has the spacer region 210 and doped region 212 beneath the channel region 208 rather than above the channel region 208. In such an embodiment, the doped region 212 extends laterally so it exists below the gate 218 and does not end at the edge of the contact stacks.

In yet another embodiment (not pictured), the device is similar to the device 200 of FIG. 9, but lacks the doped region 212 and spacer region 210. Instead, there is a doped region elsewhere in the device, similar to the doped region 111 in the device 100 pictured in FIG. 4.

Figure 10:
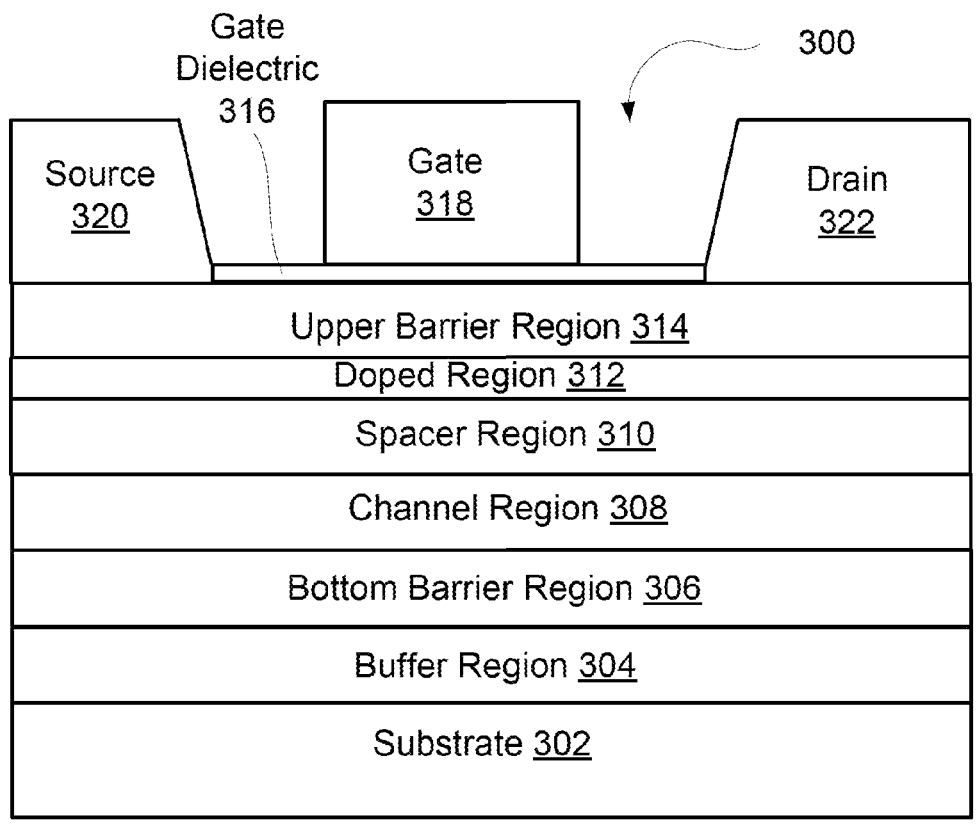
FIG. 10 is a cross sectional side view that illustrates a germanium quantum well channel transistor device, according to another embodiment of the present invention.

FIG. 10 is a cross sectional side view that illustrates a germanium quantum well channel transistor device 300, according to another embodiment of the present invention. In the device 300 of FIG. 10, one or more of the buffer region 304, barrier regions 306, 314, spacer region 310, or doped region 312 comprise a group III-V material while the channel region 308 comprises (or substantially consists of) Ge. A group III-V material includes a group III element and a group V element, such as gallium arsenide (GaAs), indium antimonide (InSb), indium phosphide (InP), and indium gallium arsenide (InGaAs).

For example, in an embodiment, the buffer region 304 comprises a group III-V material, the bottom barrier region 306, spacer region 310, and upper barrier region 314 comprise undoped GaAs, the channel region comprises Ge, and the doped region 312 comprises GaAs doped with Be, C, or Si. Such a device may provide better band offsets than if materials other than group III-V materials are used in those regions 304, 306, 310, 312. AlAs, AlGaAs, or other group III-V materials may be used in place of GaAs in some or all of the regions 304, 306, 310, 312.

Figure 11:
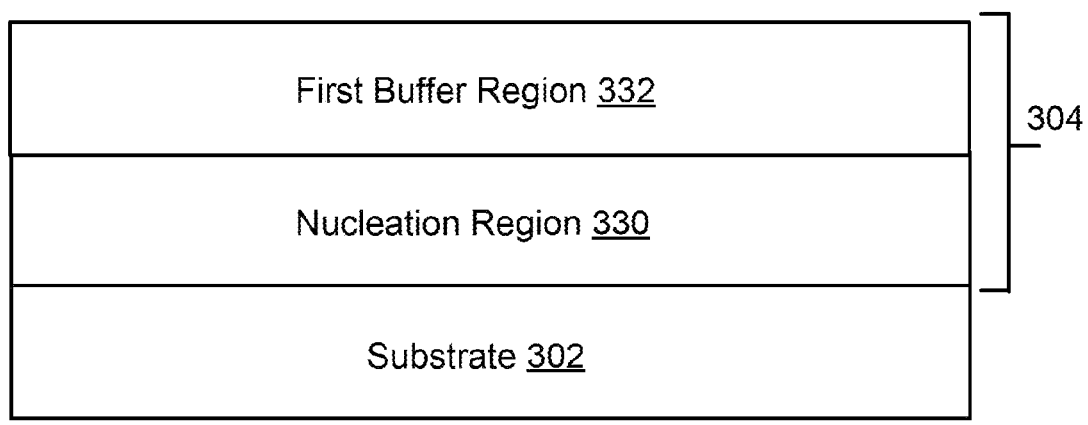
FIG. 11 is a cross sectional side view that illustrates multiple subregions of a buffer region that comprises a group III-V material.

In embodiments where the buffer region 304 comprises a group III-V material, the buffer region 304 may include multiple subregions 330, 332, as seen in FIG. 11. The substrate 302 may comprise high-resistivity p-type or n-type vicinal silicon material having regular arrays of double-stepped (100) terraces across the substrate surface in some embodiments. A vicinal surface may be prepared by offcutting the substrate 302 from an ingot. In some embodiments, the (100) substrate surface is offcut at an angle between 2 and 8 degrees towards the [110] direction. In a particular embodiment, the (100) substrate surface is offcut at an angle of about 4 degrees towards the [110] direction. A vicinal surface is a higher order crystal plane of the silicon substrate 302, such as, but not limited to the (211), (511), (013), (711) planes. In other embodiments, the substrate 302 may not have been offcut or have a vicinal surface.

The substrate 302 surface on which the device 300 is to be formed may have a resistance between about 1 ohm and about 50,000 ohms per centimeter. The high resistivity may be achieved by a low dopant concentration, lower than about $10^{16}$ carriers/cm$^3$. In other embodiments, the substrate 302 may have different resistivities or the resistance may be achieved by other methods.

In some embodiments the substrate 302 may be a substantially single-crystal silicon material, a substantially single-crystal silicon material that is doped, a multi-crystal or multi-layer substrate 302. In various embodiments, the substrate 302 could comprise germanium, germanium on silicon, or could be a silicon-on-insulator substrate 302. The substrate 302 may not comprise silicon in some embodiments, but may instead comprise a different material, such as a different semiconductor or Ge or a group III-V material such as GaAs or InP. The substrate 302 may include one or more material(s), device(s), or layer(s), or may be a single material without multiple layers.

The buffer region 304 on the substrate 302 may function to accommodate for a lattice mismatch between the substrate 302 and regions above the buffer region 304 and to confine lattice dislocations and defects. In the illustrated embodiment, the buffer region 304 has multiple regions: a nucleation region 330 and a first buffer region 332, although in other embodiments the buffer region 304 may have different numbers of regions or simply be a single region.

The nucleation region 330 comprises gallium arsenide in one embodiment, although other materials such as GaSb or AlSb may be used in other embodiments. (Note that as used herein, when materials designated by their elements without subscripts, these designations encompass any mix of percentages of the elements. For example, "InGaAs" encompasses In$_x$Ga$_{1-x}$As, with x ranging between zero (GaAs) and one (InAs). Similarly, InAlAs encompasses In$_{0.52}$Al$_{0.48}$As.) It is formed by molecular beam epitaxy (MBE), migration enhanced epitaxy (MEE), metal-organic chemical vapor deposition (MOCVD), atomic layer epitaxy (ALE), chemical beam epitaxy (CBE), or another suitable method. It may be annealed after formation to reduce dislocations. It has a thickness of less than about 1000 angstrom in some embodiments, a thickness of less than about 500 angstroms in some other embodiments. In one embodiment, the nucleation region 330 has a thickness of about 300 angstroms. In embodiments where the substrate 302 is a vicinal silicon material, the nucleation region 330 may be made sufficiently thick to fill all the terraces of the silicon substrate 302. In an alternative embodiment, other suitable nucleation region 330 materials or thicknesses may be used, or the nucleation region 330 may be omitted.

On the nucleation region 330 is a first buffer region 332 in the illustrated embodiment. In an embodiment, the first buffer region 332 comprises a GaAs material, although other materials, such as InAlAs, AlSb, or other materials may be used. In an embodiment, the first buffer region 332 consists substantially the same material as the nucleation region 330. The buffer region 332 may also be formed by molecular beam epitaxy (MBE), migration enhanced epitaxy (MEE), metal-organic chemical vapor deposition (MOCVD), atomic layer epitaxy (ALE), chemical beam epitaxy (CBE), or another suitable method. The first buffer region 332 may have a thickness of less than one micron, between 0.3 microns and one micron, about 0.3 micron, or another thickness in various embodiments.

The first buffer region 332 may be formed by the same process used to form the nucleation region 330 in some embodiments. In such an embodiment, the growth of the first buffer layer 332 may be performed at a higher temperature than that used for the nucleation layer 304. While first buffer region 332 may be considered and is shown as a separate region than nucleation region 330, both regions 330, 332 may be considered buffers, with region 332 thickening the III-V buffer region started by nucleation region 330. The film quality of region 332 may be superior to that of the nucleation region 332 because it may be formed at a higher growth temperature. Also, during the formation of region 332, the flux rate can be relatively high because the polar nucleation region 330 may eliminate danger of anti-phase domains (APD) formation.

The buffer region 332 may be a single thick non-graded buffer region 332, a multi-stepped buffer region 332, a graded buffer region 332, or another form of buffer, similar to the buffer region 104 described with respect to FIG. 2.

Note that some embodiments may lack a nucleation region 330 and/or a buffer region 332. For example, in embodiments where the substrate 302 comprises a group III-V material, the device 300 may lack nucleation region 330 and/or buffer region 332. In an embodiment where the buffer region 304 comprises SiGe, the buffer region 304 may lack a nucleation region 330 and be similar to the buffer region 104 described with respect to FIG. 2.

Returning to FIG. 10, in another embodiment the device 300 has a buffer region 304 similar to buffer region 104 and comprising SiGe and a lower barrier region 306 comprising SiGe with a channel region 308 that comprises Ge and an upper barrier region 314 that comprises GaAs or another group III-V material. The SiGe of the lower barrier region 306 (which may be in direct contact with the channel region 308) can strain the channel region 308 while the group III-V material of the upper barrier region 314 provides improved band offset.

In another embodiment, the bottom barrier region 306 comprises a group III-V material, the buffer region 304 comprises SiGe or a group III-V material, the channel region 308 comprises Ge, and the upper barrier region 314 comprises SiGe. Various other combinations of SiGe and group III-V materials in the barrier regions 306, 314, spacer region 310, and buffer region 304 may also be used. Also, embodiments with the doped region 312 and spacer region 310 being under the channel region 308 (as seen in FIG. 3) or that lack a blanket doped region 312 and instead have alternative doped regions (as doped regions 111 seen in FIG. 4) are also possible. In addition, the etch stop region 240 and additional spacer region 242 of FIGS. 5-9 may also be used in embodiments of a device 300 that has group III-V material as one or more of the buffer region 304, barrier regions 306, 314, spacer region 310, or doped region 312.

Figure 12:
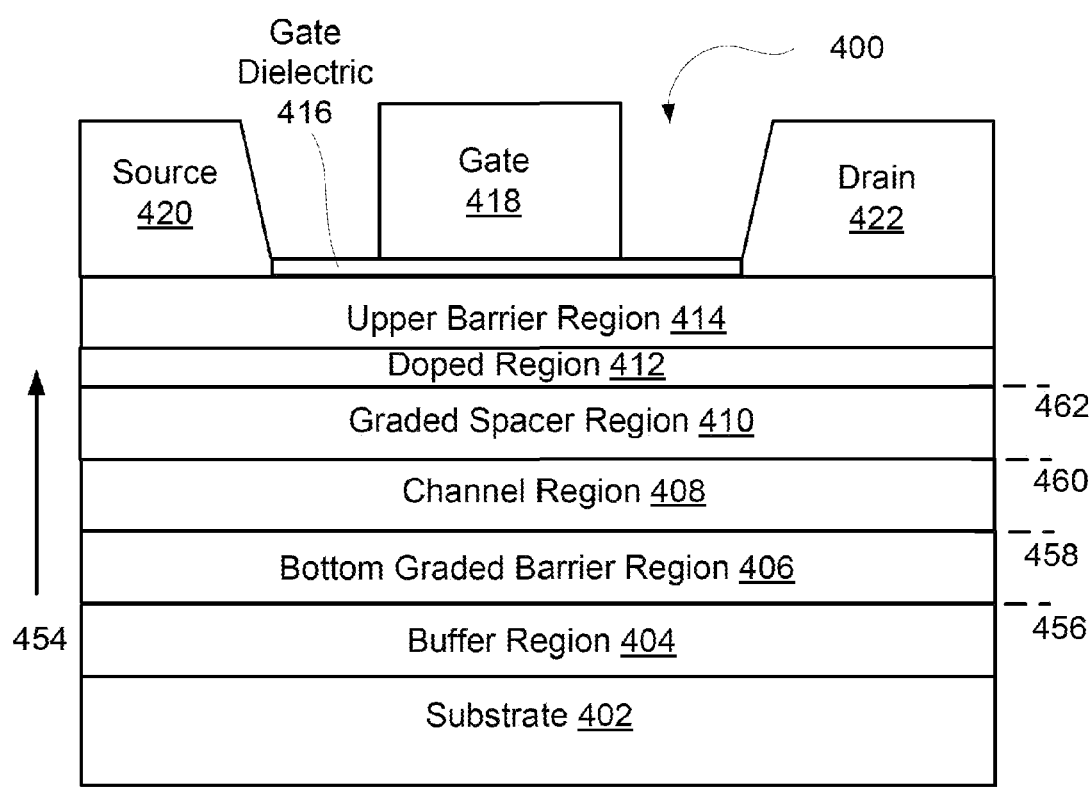
FIG. 12 is a cross sectional side view that illustrates a germanium quantum well channel transistor device that has one or more non-homogenous barrier and/or spacer regions.

FIG. 12 is a cross sectional side view that illustrates a germanium quantum well channel transistor device 400 that has one or more non-homogenous barrier 406, 414 and/or spacer 410 regions, according to another embodiment of the present invention. Rather than have a homogenous material composition through the thickness of the region(s) 406, 414, and/or 410, the material is non-homogenous to be transitioned to be more similar to the channel region 408 closer to the channel region 408 and less similar to the channel region 408 further from the channel region 408.

Figure 12A:
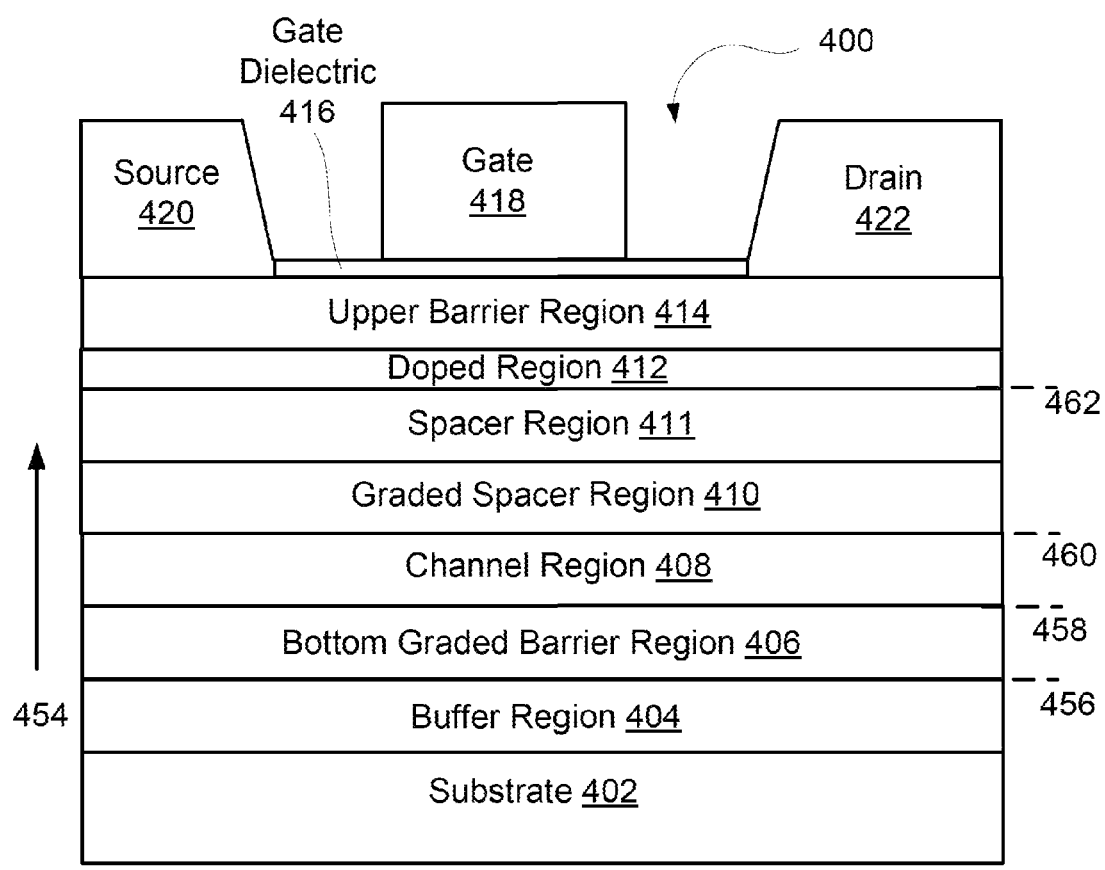
FIG. 12a is a cross sectional side view that illustrates a germanium quantum well channel transistor device having a non-graded spacer region between a graded spacer region and a doped region.

FIG. 12a is a cross sectional side view similar to FIG. 12, but includes a non-graded spacer region 411 between the graded spacer region 410 and the doped region 412. In some embodiments, there may be such a non-graded, relatively homogenous spacer region 411 between the graded spacer region 410 and the doped region 412. The spacer region 411 may consist substantially of the same material as the top portion of the graded spacer region 410 in some embodiments, although in other embodiments, it may have a different composition.

For example, in an embodiment, the bottom 456 of the lower barrier region 406 comprises SiGe. The channel region 408 consists substantially of germanium. The lower barrier region 406 is graded so that there is more and more germanium until at the top 458 of the lower barrier region 406 it consists substantially of germanium. Similarly, the spacer region 410 is substantially germanium at the bottom 460. The spacer region 410 is graded so that there is less germanium and more silicon towards the top 462 of the spacer region 410.

Figure 13:
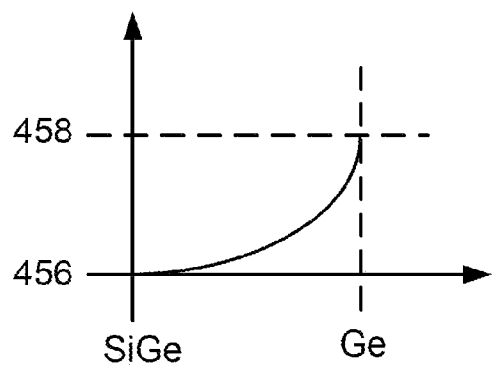
FIGS. 13 through 20 are graphs that illustrate bottom barrier and spacer region material compositions according to various embodiments of the present invention.
Figure 14:
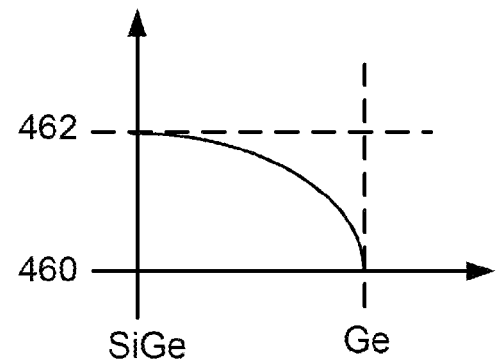

FIGS. 13 and 14 are graphs that illustrate a graded bottom barrier region 406 and spacer region 410 according to one embodiment of the present invention. FIG. 13 is a graph that illustrates the composition of the bottom barrier region 406 between its bottom 456 and top 458, and FIG. 14 is a graph that illustrates the composition of the spacer region 410 between its bottom 460 and top 462. As seen in FIG. 13, the bottom barrier 406 comprises SiGe at its bottom 456, with more Ge and less Si further towards the top 458, until at the top 458 the bottom barrier 406 is substantially all Ge (in this embodiment, the channel region 408 is substantially all Ge—in other embodiments, the top 458 of the barrier region 406 reaches a composition substantially the same as the composition of the channel region 408). FIG. 14 shows the reverse of this with respect to the spacer region 410: the spacer region 410 is substantially all Ge at the bottom 460 with more Si and less Ge further towards the top 462 until at the top 462 the spacer region 410 is SiGe.

Figure 15:
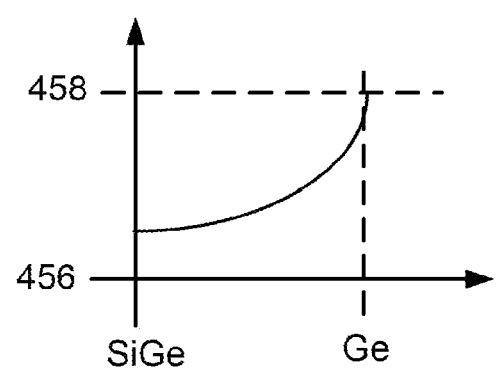
Figure 16:
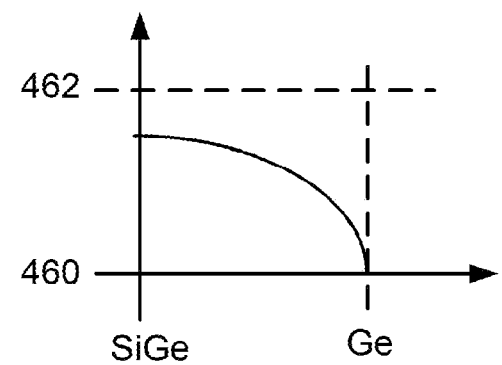

FIGS. 15 and 16 are graphs that illustrate a graded bottom barrier region 406 and spacer region 410 according to one embodiment of the present invention. FIG. 15 is a graph that illustrates the composition of the bottom barrier region 406 between its bottom 456 and top 458, and FIG. 16 is a graph that illustrates the composition of the spacer region 410 between its bottom 460 and top 462. As seen in FIG. 15, the bottom barrier 406 comprises SiGe at its bottom 456 and remains at the same composition for a portion of its thickness. Then, partway through the thickness of the bottom barrier 406, the Si starts to decrease and Ge increase, until at the top 458 the bottom barrier 406 is substantially all Ge. FIG. 16 shows the reverse of this with respect to the spacer region 410: the spacer region 410 is substantially all Ge at the bottom 460 with more Si and less Ge further towards the top 462 until it hits a selected ratio of Si to Ge. It continues at this selected composition until the top 462. (Note that the embodiment illustrated in FIG. 12a corresponds to the graph of FIG. 16—the portion that has a relatively homogenous selected ratio of Si to Ge may be the spacer region 411 rather than a portion of the graded spacer region 410. Similarly, the bottom portion of bottom barrier 406 may be considered simply a portion of the bottom barrier 406 or may be considered a different relatively homogenous region.)

Figure 17:
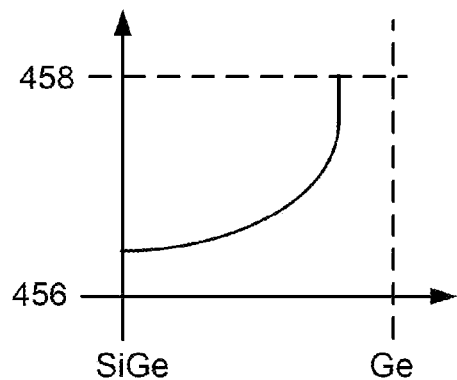
Figure 18:
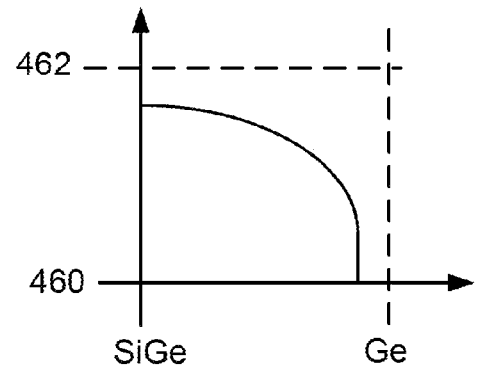

FIGS. 17 and 18 are graphs that illustrate a graded bottom barrier region 406 and spacer region 410 according to another embodiment of the present invention. FIG. 17 is a graph that illustrates the composition of the bottom barrier region 406 between its bottom 456 and top 458, and FIG. 16 is a graph that illustrates the composition of the pacer region 410 between its bottom 460 and top 462. As seen in FIG. 17, the bottom barrier 406 comprises SiGe at its bottom 456 and remains at the same composition for a portion of its thickness. Then, partway through the thickness of the bottom barrier 406, the Si starts to decrease and Ge increase, until at the top 458 the bottom barrier 406 has a selected composition. In this embodiment the selected composition at the top 458 is not the same as the composition of the channel region 408. FIG. 18 shows the reverse of this with respect to the spacer region 410: the spacer region 410 has a first composition somewhat different from the composition of the channel region 408 at the bottom 460, and the composition of the spacer region 410 becomes less similar to the composition of the channel region 408 further towards the top 462 until it hits a selected composition and continues at this selected composition until the top 462.

Figure 19:
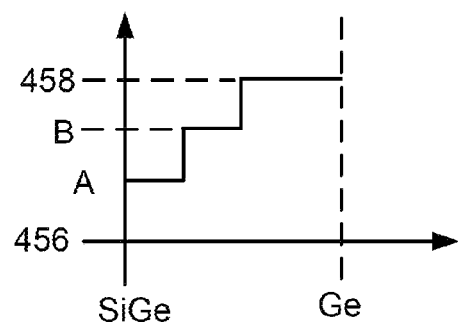
Figure 20:
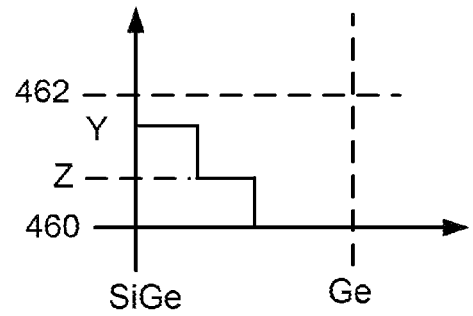

FIGS. 19 and 20 are graphs that illustrate a stepped bottom barrier region 406 and spacer region 410 according to another embodiment of the present invention. In contrast to the embodiments shown in FIGS. 13-18, the bottom barrier region 406 and spacer region 410 have discrete steps of changed composition, rather than a relatively smooth gradation. FIG. 19 is a graph that illustrates the composition of the bottom barrier region 406 between its bottom 456 and top 458, and FIG. 20 is a graph that illustrates the composition of the pacer region 410 between its bottom 460 and top 462. As seen in FIG. 19, the bottom barrier 406 comprises SiGe at its bottom 456 and remains at the same composition for a portion of its thickness. The amount of Si increases and Ge decreases in steps rather than smoothly, until at the top 458 the bottom barrier 406 has a selected composition. FIG. 20 shows the reverse of this with respect to the spacer region 410: the spacer region 410 has decreasing Ge and increasing Si in stepped increments until it hits a selected composition and continues at this selected composition until the top 462.

While the examples in FIGS. 13 through 20 show SiGe and Ge, these same two compositions were consistently used in each Figure only for clarity. This does not indicate that they are the materials used in all possible embodiments. Different materials in addition to or in place of Si and Ge may be used under the same non-homogenous concept. For example, the bottom barrier region 406 may comprises 60% SiGe and 40% Si at the bottom 456 and include more and more Ge as one moves towards the top 458, which may be substantially all Ge or still include some Si. Also, materials other than Si and/or Ge may be used.

Note that while FIGS. 15 and 16 appear to show only a small portion of the thickness of the bottom barrier 406 and spacer 410 having the SiGe composition, the graphs are not to scale, and it may be that the majority of the thicknesses of the bottom barrier 406 and spacer 410 having a homogenous SiGe composition, with a small portion of their thicknesses including a graded composition change. For example, 80%, 90% or more of the thicknesses of the bottom barrier 406 and spacer 410 may comprise a homogenous material (in the illustrated case, SiGe), although in other embodiments different percentages of the bottom barrier 406 and spacer 410 may be homogenous. This is true for the embodiments illustrated in the other graphs of FIGS. 13-20 as well—the graphs are not to scale but merely illustrate that a portion of the thicknesses of the bottom barrier 406 and spacer 410 may form a non-homogenous transition between material composition of the portions of the bottom barrier 406 and spacer 410 further from the channel region 408 to have a composition more similar to the channel region 408 at locations of the bottom barrier 406 and spacer 410 closer to the channel region 408, so that the difference between the composition of the channel region 408 and regions immediately adjacent the channel region 408 are not so great.

By having more gradual changes in composition at the boundaries between the bottom barrier region 406 and channel region 408 and between the channel region 408 and the spacer region 410, the carriers of the device 400 may be better located in the middle of the channel region 408 rather than at an abrupt interface between dissimilar materials of the channel region 408 and a spacer 410 or barrier 406 adjacent the channel region 408, which may improve device performance.

While FIG. 12 illustrated a device 400 with a doped region 412 above the channel region 408, the device 400 may have other arrangements while retaining the use of a graded or stepped transition from a first selected composition of the barrier region 406 or spacer region 410 to a composition more similar to the channel region 408 at locations closer to the channel region 408. Embodiments with the doped region 412 and spacer region 410 being under the channel region 408 (similar to the device seen in FIG. 3, in which case the upper barrier 414 would have a non-homogenous transition portion rather than the lower barrier 406) or that lack a blanket doped region 412 and instead have alternative doped regions (similar to doped regions 111 seen in FIG. 4, in which case the upper barrier 414 would have a transitional portion instead of the spacer 410) are also possible. In addition, the etch stop region 240 and additional spacer region 242 of FIGS. 5-9 may also be used in embodiments of a device 400 that has less abrupt material transitions between the channel region 408 and immediately adjacent regions. Also, one or more of the spacer 410, bottom barrier 406, or top barrier 414 regions may comprise a group III-V material as is described with respect to FIGS. 10 and 11.

Figure 21:
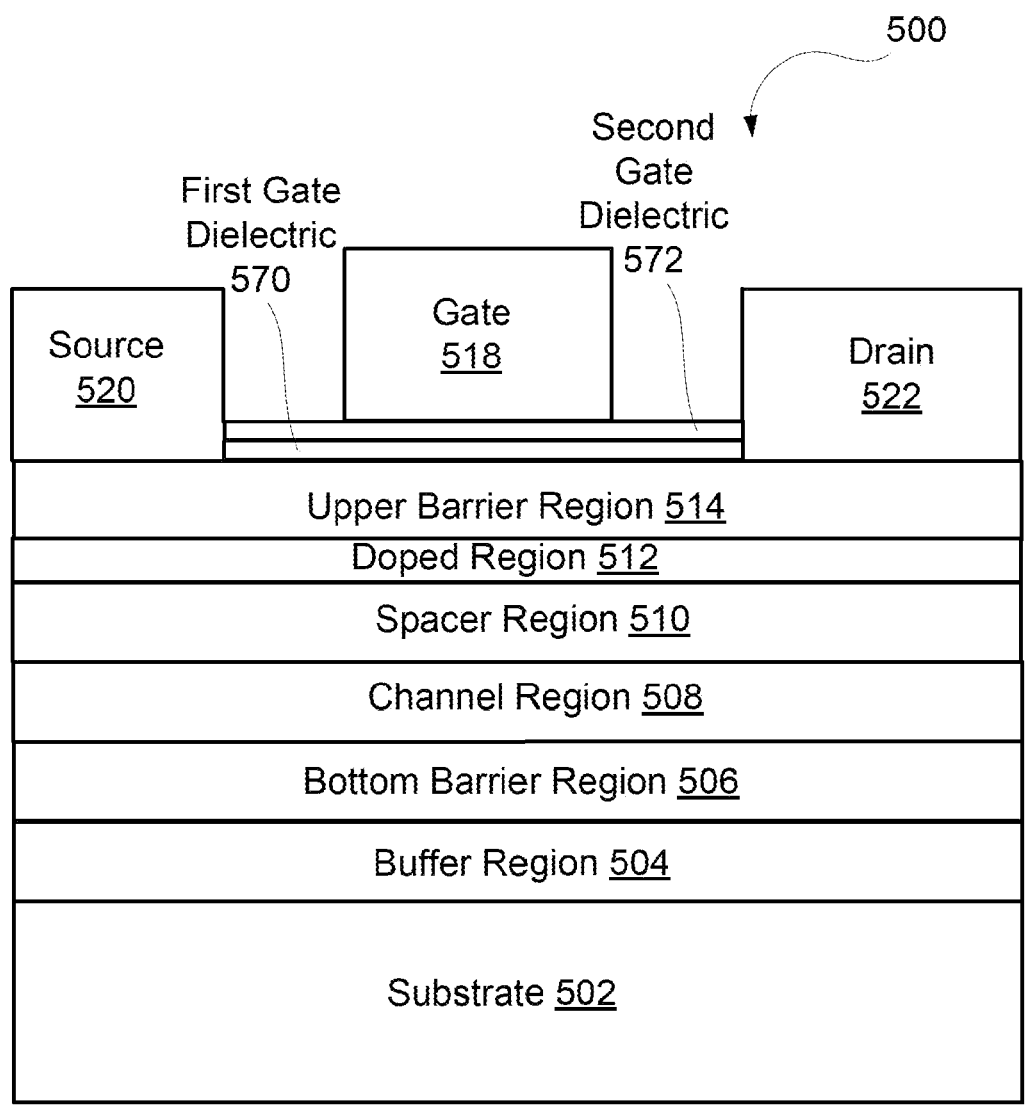
FIG. 21 is a cross sectional side view that illustrates a germanium quantum well channel transistor device that has multiple gate dielectric regions.

FIG. 21 is a cross sectional side view that illustrates a germanium quantum well channel transistor device 500 that has multiple gate dielectric regions 570, 572, according to another embodiment of the present invention. In some cases a desired gate dielectric material may have compatibility issues with the material on which the gate dielectric is to be formed or other problems. Rather than avoiding that desired gate dielectric material entirely, the gate dielectric may comprise multiple gate dielectric regions 570, 572. While FIG. 21 shows two gate dielectric regions 570, 572, more than two may be used in other embodiments.

For example, it may be advantageous to use $HfO_2$ as a gate dielectric material. However, having $HfO_2$ in contact with a Ge or SiGe-containing upper barrier region 514 or other region immediately below the gate dielectric may result in various problems that negatively affect the device 500. To avoid these problems, a first gate dielectric 570 of hafnium silicate may be formed, followed by a second gate dielectric 572 of $HfO_2$. Other materials such as aluminum oxide, TaSiO, TaSiON, $La_2O_3$, or other materials can be used for the first gate dielectric region 570. Other materials such as $ZrO_2$, $Ti_2O_5$, $Ta_2O_5$, HfSiON, HfSiO, or other materials can be used for the second gate dielectric region 572. The second gate dielectric 572 may have a higher dielectric constant than the first dielectric region 570 in some embodiments, although this is not necessary.

The multiple dielectric regions 570, 572 of FIG. 21 may be applicable to any of the other embodiments of devices described herein. The doped region 512 may be above the channel region 508, below the channel region 508, or elsewhere. The regions immediately adjacent the channel region 508 may have varying composition to avoid an abrupt transition to the material composition of the channel region 508. The etch stop region 240 and additional spacer region 242 of FIGS. 5-9 may also be used with multiple gate dielectric regions 570, 572. Also, one or more of the spacer 510, bottom barrier 506, or top barrier 514 regions may comprise a group III-V material as is described with respect to FIGS. 10 and 11.

Figure 22:
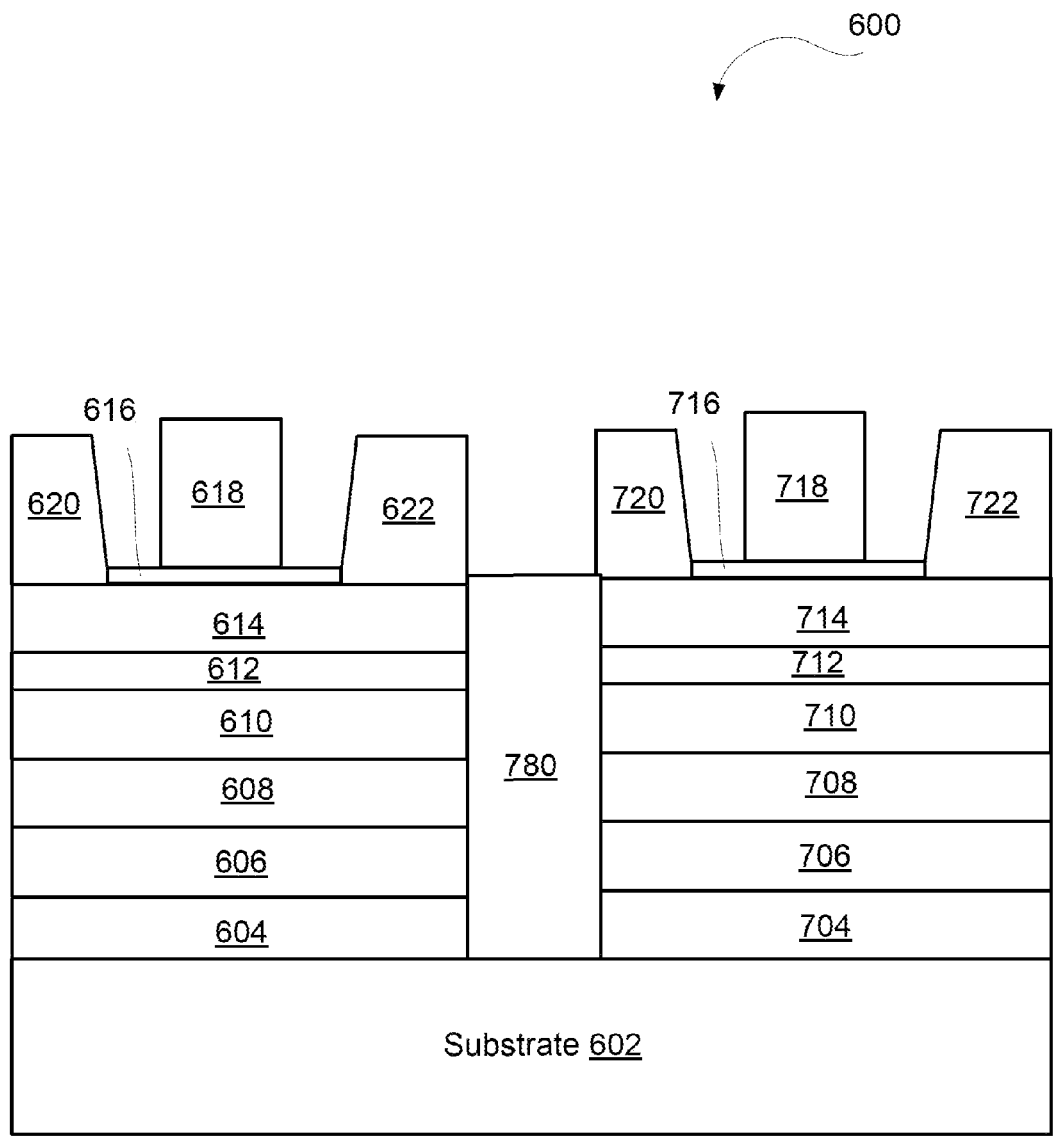
FIG. 22 is a cross sectional side view that illustrates a device with a germanium quantum well channel region transistor and a group III-V material quantum well channel region transistor on the same substrate.

FIG. 22 is a cross sectional side view that illustrates a device 600 with a germanium quantum well channel region 608 transistor (on the left side of FIG. 22) and a group III-V material quantum well channel region 708 transistor (on the right side of FIG. 22) on the same substrate 602, according to one embodiment of the present invention. In some embodiments, germanium quantum well channel transistors, such as those shown and described in FIGS. 1-21, may be used as PMOS transistors while other types of transistors, such as the group III-V material quantum well channel region 708 transistor, may be used as NMOS transistors. These combinations of different types of transistors may make up CMOS circuitry in various different systems, such as a computer central processing unit.

In the embodiment shown in FIG. 22, the germanium quantum well channel region 608 transistor may have any structure as described herein. One such structure is a substrate 602, buffer region 604, bottom barrier region 606, channel region 608 consisting substantially of germanium, spacer region 610, doped region 612, upper barrier region 614, gate dielectric 616, gate electrode 618, source region 620 and drain region 622. There may be an isolation region 680 between the germanium quantum well channel region 608 transistor and the group III-V material quantum well channel region 708 transistor.

The group III-V material quantum well channel region 708 transistor may comprise many different types of group III-V material quantum well channel region 708 transistors. In one embodiment, it includes a buffer region 704 (which may include a nucleation region) comprising GaAs, a lower barrier region 706 comprising InAlAs, a channel region 708 comprising InGaAs, a spacer region 710 comprising InAlAs, a doped region 712 comprising doped InAlAs, an upper barrier region 714 comprising InAlAs, a gate dielectric 716, a gate 718, a source region 720, and a drain region 722. In other embodiments, different materials and/or structures may be used with the group III-V material quantum well channel region 708 transistor.

As, in some embodiments, a germanium quantum well channel transistor may provide better PMOS performance, and a group III-V material quantum well channel transistor may provide better NMOS performance, the use of both types of transistors on a single substrate 602 may provide better overall device 600 performance than if just one type of transistor were used for both NMOS and PMOS transistors.

Figure 23:
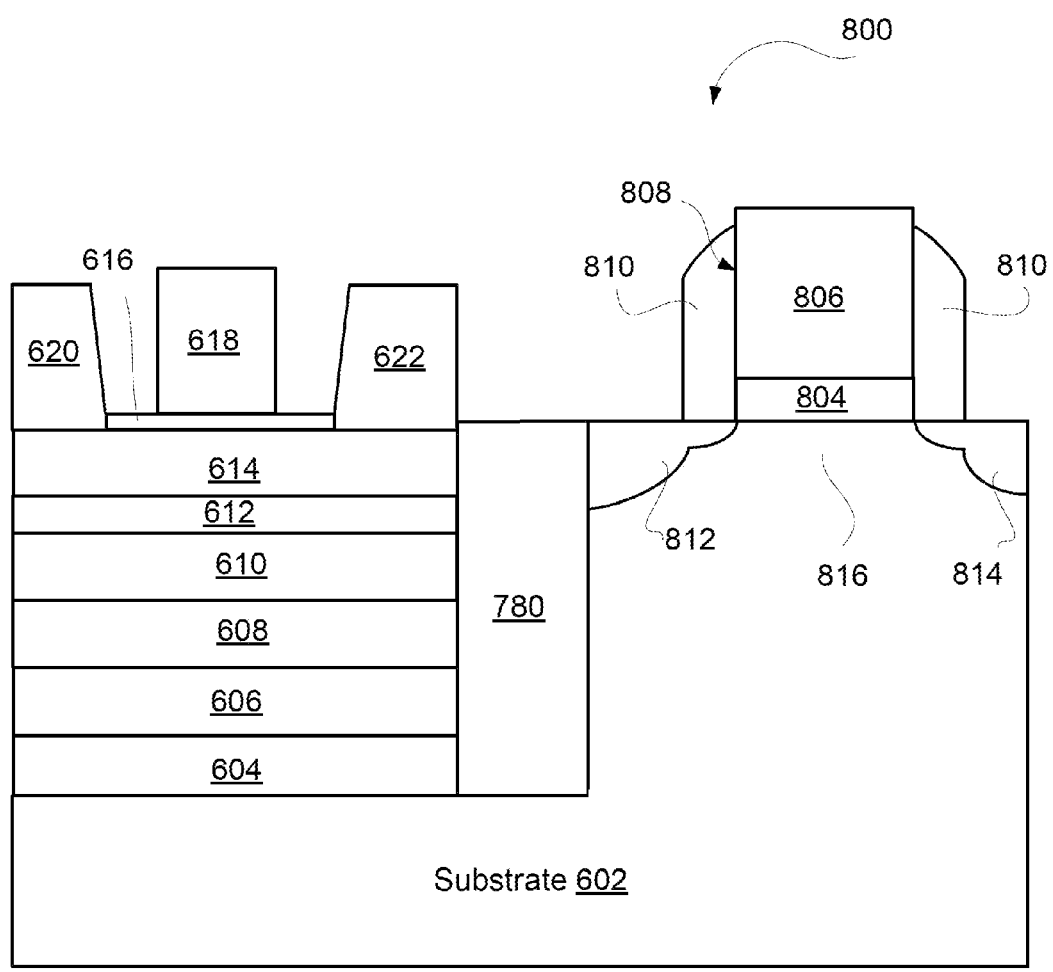
FIG. 23 is a cross sectional side view that illustrates a device with a germanium quantum well channel region transistor and a non-quantum well channel transistor on the same substrate.

FIG. 23 is a cross sectional side view that illustrates a device 800 with a germanium quantum well channel region 608 transistor (on the left side of FIG. 23) and a non-quantum well channel transistor (on the right side of FIG. 23, also referred to as a "standard" transistor) on the same substrate 602, according to one embodiment of the present invention. In some embodiments, germanium quantum well channel transistors, such as those shown and described in FIGS. 1-21, may be used as PMOS transistors while other types of transistors, such well known silicon transistors that have been widely used for decades, may be used as NMOS transistors. These combinations of different types of transistors may make up CMOS circuitry in various different systems, such as a computer central processing unit.

In the embodiment shown in FIG. 23, the germanium quantum well channel region 608 transistor may have any structure as described herein. One such structure is a substrate 602, buffer region 604, bottom barrier region 606, channel region 608 consisting substantially of germanium, spacer region 610, doped region 612, upper barrier region 614, gate dielectric 616, gate electrode 618, source region 620 and drain region 622. There may be an isolation region 780 between the germanium quantum well channel region 608 transistor and the group III-V material quantum well channel region 708 transistor. Trenches may have been formed in the substrate 602 and then filled in by the regions of the germanium quantum well channel region 608 transistor to result in the device 800 shown in FIG. 23. In other embodiments, such trenches may be avoided, in which case the germanium quantum well channel region 608 transistor may extend above the non-quantum well channel transistor.

The standard transistor may take one of many different structures and use many different materials, as is known in the art. In one embodiment, it includes a gate dielectric 804 and a gate electrode 806 on the gate dielectric 804. Adjacent sidewalls 808 of the gate dielectric 804 and gate electrode 806 are spacers 810. In the substrate 602 on either side of the gate dielectric 804 and gate electrode 806 are a source region 812 and a drain region 814. Between the source region 812 and drain region 814 in the substrate 602 is a channel region 816. The standard transistor may have a silicon dioxide gate dielectric 804 and polysilicon gate 806, a high-k gate dielectric 804 and a metal gate 806, may be a planar or multigate transistor, and take various other forms and use various materials.

As, in some embodiments, a germanium quantum well channel transistor may provide better PMOS performance, and a standard transistor may provide better NMOS performance, the use of both types of transistors on a single substrate 602 may provide better overall device 800 performance than if just one type of transistor were used for both NMOS and PMOS transistors.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not necessarily indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method of fabricating a microelectronic device, comprising:
   forming a lower barrier region comprising a large band gap material;
   forming a quantum well channel region comprising germanium on the lower barrier region;
   forming an upper barrier region comprising a large band gap material on the quantum well region;
   forming a spacer region on the quantum well channel region;
   forming an etch stop region on the spacer region, the etch stop region comprising silicon and being substantially free from germanium;
   forming a gate dielectric on the etch stop region;
   forming a gate electrode on the gate dielectric;
   forming a doped region on the lower barrier region, the doped region comprising silicon germanium doped with boron; and
   forming a lower spacer region comprising silicon germanium on the doped region and under the quantum well channel region.

2. The method of claim 1, wherein forming the spacer region on the quantum well channel region comprises forming a silicon germanium spacer region on the quantum well channel region.

3. The method of claim 1, wherein forming the gate dielectric on the etch stop region comprises forming the gate dielectric directly on the etch stop region.

4. The method of claim 1, wherein forming the etch stop region on the spacer region comprises forming a first portion comprising silicon and forming a second portion on the first portion.

5. The method of claim 4, wherein forming the second portion comprises forming a silicon dioxide second portion.

6. The method of claim 5, wherein forming the gate dielectric on the etch stop region comprises forming the gate dielectric directly on the second portion of the etch stop region.

7. The method of claim 1, wherein forming the etch stop region on the spacer region comprises forming the etch stop region on the etch stop region, wherein the etch stop region has a thickness of less than twenty angstroms.

8. The method of claim 1, wherein forming the lower barrier region comprises forming a silicon germanium lower barrier region.

9. The method of claim 1, wherein forming the lower barrier region comprises forming the lower barrier region from a group III-V material.

10. The method of claim 9, wherein forming the lower barrier region comprises forming a GaAs lower barrier region.

11. The method of claim 1, wherein forming the upper barrier region comprises forming a silicon germanium upper barrier region.

12. The method of claim 1, wherein forming the upper barrier region comprises forming the lower barrier region from a group III-V material.

13. The method of claim 1, wherein forming the lower barrier region, forming the quantum well channel region, forming the upper barrier region, forming the spacer region, forming the etch stop region, forming the gate dielectric, and forming the gate electrode are all part of forming a p-type transistor, and further comprises forming an n-type transistor comprising:
 forming a lower barrier region comprising a group III-V material;
 forming a quantum well channel region comprising a group III-V material on the lower barrier region;
 forming an upper barrier region comprising a group III-V material on the quantum well region;
 forming a gate dielectric on the quantum well channel region and not in contact with the quantum well channel region; and
 forming a gate electrode on the gate dielectric.

14. The method of claim 1, wherein forming the lower barrier region, forming the quantum well channel region, forming the upper barrier region, forming the spacer region, forming the etch stop region, forming the gate dielectric, and forming the gate electrode are all part of forming a p-type transistor, and further comprises forming an n-type transistor comprising:
 forming a source region in a substrate;
 forming a drain region in the substrate;
 forming a channel region in the substrate and between the source and drain regions;
 forming a gate dielectric on the channel region, wherein the channel region has side walls;
 forming a gate electrode on the gate dielectric and having side walls; and
 forming spacers adjacent the side walls of the gate dielectric and adjacent the side walls of the gate electrode.

* * * * *